(12) United States Patent
Hamada

(10) Patent No.: US 9,281,432 B2
(45) Date of Patent: Mar. 8, 2016

(54) PHOTOELECTRIC CONVERSION ELEMENT, METHOD FOR MANUFACTURING THE SAME, OPTICAL SENSOR, AND SOLAR CELL

(71) Applicant: SEIKO EPSON CORPORATION, Tokyo (JP)

(72) Inventor: Yasuaki Hamada, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/557,177

(22) Filed: Dec. 1, 2014

(65) Prior Publication Data

US 2015/0155418 A1     Jun. 4, 2015

(30) Foreign Application Priority Data

Dec. 3, 2013  (JP) ................................. 2013-250574
Mar. 5, 2014  (JP) ................................. 2014-043283

(51) Int. Cl.

| | |
|---|---|
| *H01L 31/072* | (2012.01) |
| *H01L 31/109* | (2006.01) |
| *H01L 31/032* | (2006.01) |
| *H01L 31/18* | (2006.01) |
| *H01L 31/036* | (2006.01) |
| *H01L 21/02* | (2006.01) |

(52) U.S. Cl.
CPC ........ *H01L 31/072* (2013.01); *H01L 21/02414* (2013.01); *H01L 21/02565* (2013.01); *H01L 21/02579* (2013.01); *H01L 21/02628* (2013.01); *H01L 31/032* (2013.01); *H01L 31/036* (2013.01); *H01L 31/109* (2013.01); *H01L 31/18* (2013.01)

(58) Field of Classification Search
CPC ............ H01L 51/0051; H01L 51/0052; H01L 31/0224
USPC ............................................ 257/40, 290–294
See application file for complete search history.

(56) References Cited

U.S. PATENT DOCUMENTS

| | | | | |
|---|---|---|---|---|
| 4,927,721 | A | 5/1990 | Gratzel et al. | |
| 8,637,860 | B2 * | 1/2014 | Nomura | H01L 51/0052 257/40 |
| 8,841,651 | B2 * | 9/2014 | Mitsui | H01L 51/0051 257/40 |
| 8,889,040 | B2 * | 11/2014 | Yoshino | H01L 31/0224 106/1.14 |

FOREIGN PATENT DOCUMENTS

| | | |
|---|---|---|
| JP | 53-033084 | 3/1978 |
| JP | 01-220380 | 9/1989 |
| JP | 2006-093385 | 4/2006 |
| JP | 2012-038783 | 2/2012 |

* cited by examiner

*Primary Examiner* — Cuong Q Nguyen
(74) *Attorney, Agent, or Firm* — Workman Nydegger

(57) ABSTRACT

A photoelectric conversion element includes a PN junction formed between an N-type oxide layer and a P-type oxide layer, in which the N-type oxide layer is formed of an oxide having a perovskite structure containing titanium and strontium, a part of strontium is substituted with a +3 valence metal element or a part of titanium is substituted with a +5 valence metal element, and the amount of the metal element substituted in the N-type oxide layer is 0.01 mass % to 0.75 mass %.

10 Claims, 3 Drawing Sheets

PHOTOELECTRIC CONVERSION ELEMENT, METHOD FOR MANUFACTURING THE SAME, OPTICAL SENSOR, AND SOLAR CELL

BACKGROUND

1. Technical Field

The present invention relates to a photoelectric conversion element, a method for manufacturing the same, an optical sensor, and a solar cell.

2. Related Art

In the related art, a photoelectric conversion element which converts light energy into electrical energy has been widely used in an illuminometer as a photodiode photodetector, a camera exposure meter, an auto strobe optical sensor, a smoke sensor, an optical remote controller, a position measuring sensor, or the like.

As a product using the principle of a photodiode, a solar cell capable of reducing a load to the environment has drawn attention. As a solar cell, a solar cell using silicon as a photoelectric conversion material is widely known (for example, refer to JP-A-53-33084) and is substantially divided into three types of single crystalline type, polycrystalline type, and amorphous type, each of which has been put into practical use.

Study of a next-generation solar cell has become popular and a wet type dye sensitized solar cell in which an electrolyte is charged between an anode electrode and a cathode electrode is proposed (for example, refer to JP-A-1-220380). Further, a photoelectric conversion element including a transparent electrode formed of an n-type oxide semiconductor as a light receiving side electrode, in which a p-type semiconductor layer having the energy difference between a Fermi level and the lower limit of a conduction band that is larger than the energy difference between a Fermi level and the lower limit of a conduction band in the p-type semiconductor layer is further joined between the transparent electrode and the p-type semiconductor layer, is proposed (for example, refer to JP-A-2012-38783).

In addition, a photoelectric conversion structure including a film structure formed of a photovoltaic material, and a positive electrode and a negative electrode, in which the film structure is a structure in which an orientation control layer is laminated or a dielectric layer is laminated on the upper part of the orientation control layer, is proposed (for example, refer to JP-A-2006-93385).

However, for the silicon-based solar cell as described in JP-A-53-33084, a high manufacturing cost is incurred and the manufacturing conditions have to be strictly controlled, and further, a large amount of energy is required in the manufacturing. Thus, there is still room for examination from the viewpoint of energy saving and mass productivity.

In the dye sensitized solar cell as described in JP-A-1-220380, the electrolyte is evaporated after long-term use and thus the electrode performance is lowered.

In the photoelectric conversion element as described in JP-A-2012-38783, it is necessary to provide a predetermined p-type transparent semiconductor layer to be interposed between the n-type oxide semiconductor and the p-type semiconductor layer or to set the energy levels of the p-type transparent semiconductor layer and the p-type semiconductor layer to have a predetermined relationship. Thus, the configuration and the manufacturing process easily become complicated and the configuration is disadvantageous from the viewpoint of simplicity and mass productivity.

Further, the photoelectric conversion structure described in JP-A-2006-93385 utilizes the ferroelectric properties of the dielectric layer, but in a photoelectric conversion apparatus using such a principle, the photoelectric conversion efficiency is easily reduced and a large photoelectric current is not easily obtained. Further, depending on the dielectric material, it is necessary to carry out a polarization treatment in which polarization voltage for voluntarily aligning the electric dipole moment is applied and thus, the configuration is also disadvantageous from the viewpoint of simplicity and mass productivity.

SUMMARY

An advantage of some aspects of the invention is to provide a photoelectric conversion element capable of obtaining a large photoelectric current and having excellent simplicity and mass productivity, a method for manufacturing the same, an optical sensor, and a solar cell.

According to an aspect of the invention, there is provided a photoelectric conversion element including a PN junction formed between an N-type oxide layer and a P-type oxide layer, in which the N-type oxide layer is formed of an oxide having a perovskite structure containing titanium and strontium, a part of strontium is substituted with a +3 valence metal element or a part of titanium is substituted with a +5 valence metal element, and the amount of the metal element substituted in the N-type oxide layer is 0.01 mass % to 0.75 mass %.

According to the aspect, it is possible to provide a semiconductor type photoelectric conversion element capable of obtaining a large photoelectric current and having excellent simplicity and mass productivity.

Here, it is preferable that the amount of the metal element substituted in the N-type oxide layer be 0.05 mass % to 0.75 mass %. Accordingly, a semiconductor type photoelectric conversion element capable of obtaining a large photoelectric current and having excellent simplicity and mass productivity is easily provided.

It is preferable that the metal element be a lanthanoid element or a niobium element. Accordingly, a function as an N-type semiconductor can be suitably provided and thus a semiconductor type photoelectric conversion element capable of obtaining a large photoelectric current and having excellent simplicity and mass productivity is easily provided.

It is preferable that the P-type oxide layer be formed of an oxide having a perovskite structure. Accordingly, a good PN junction can be formed between the N-type oxide layer and the P-type oxide layer.

It is preferable that the P-type oxide layer be formed of bismuth ferrate or lead zirconate titanate. Accordingly, a good PN junction is more easily formed between the N-type oxide layer and the P-type oxide layer.

It is preferable that the P-type oxide layer further contain at least one element selected from lead, calcium, strontium, barium, lithium, sodium, and potassium at an A site. Accordingly, a function as a P-type semiconductor is easily provided.

It is preferable that the P-type oxide layer further contain at least one element selected from aluminum, chrome, iron, cobalt, nickel, copper, and zinc at a B side. Accordingly, a function as a P-type semiconductor is easily provided.

It is preferable that the P-type oxide layer be formed on a substrate formed of an N-type oxide by a film forming process to form the PN junction. Accordingly, a photoelectric conversion element can be manufactured by a relatively simple process at a low cost by sequentially forming the P-type oxide layer on the N-type oxide layer.

According to another aspect of the invention, there is provided a method for manufacturing a photoelectric conversion element having a PN junction formed between an N-type oxide layer and a P-type oxide layer, including forming the P-type oxide layer on the N-type oxide layer, which is formed of an oxide having a perovskite structure containing titanium and strontium and in which a part of strontium is substituted with a +3 valence metal element or a part of titanium is substituted with a +5 valence metal element, by a solution application method.

According to the aspect, it is possible to manufacture a photoelectric conversion element capable of obtaining a large photoelectric current by a relatively simple process. Thus, it is possible to provide a semiconductor type photoelectric conversion element having excellent simplicity and mass productivity.

According to still another aspect of the invention, there is provided an optical sensor including the photoelectric conversion element according to any one of the above aspects. According to the aspect, it is possible to provide an optical sensor including a semiconductor type photoelectric conversion element capable of obtaining a large photoelectric current and having excellent simplicity and mass productivity.

According to still another aspect of the invention, there is provided a solar cell including the photoelectric conversion element according to any one of the above aspects. According to the aspect, it is possible to provide a solar cell including a semiconductor type photoelectric conversion element capable of obtaining a large photoelectric current and having excellent simplicity and mass productivity.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1A:
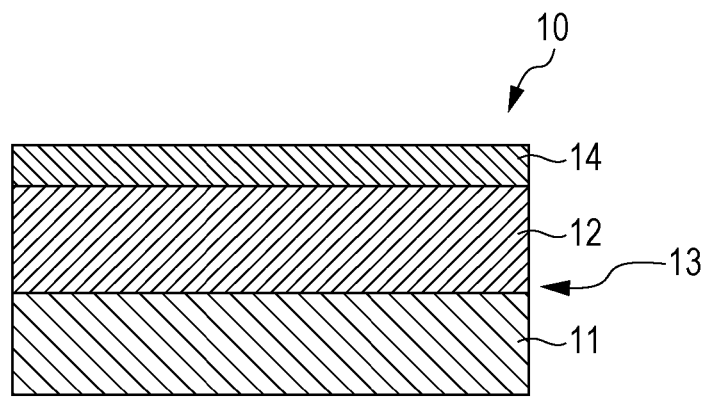
FIGS. 1A and 1B are views showing configuration examples of a photoelectric conversion element and an optical sensor according to embodiments of the invention.
Figure 1B:
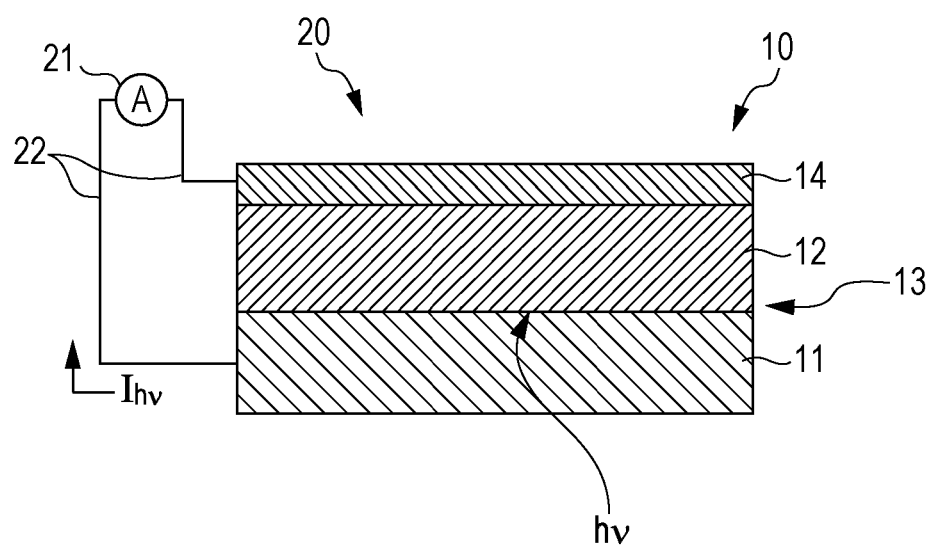

FIGS. 1A and 1B are views showing schematic configurations of a photoelectric conversion element and the like according to an embodiment of the invention.

A photoelectric conversion element 10 shown in FIG. 1A has a PN junction 13 formed between an N-type oxide layer 11 and a P-type oxide layer 12.

In the photoelectric conversion element 10, the N-type oxide layer 11 is configured to function as a substrate and an electrode and the P-type oxide layer 12 and a counter electrode 14 are sequentially laminated on the N-type oxide layer 11. Depending on the material constituting the N-type oxide layer 11, a substrate and an electrode may be separately provided on the opposite side of the P-type oxide layer 12.

In addition, in the photoelectric conversion element 10, the N-type oxide layer 11 and the P-type oxide layer 12 are configured respectively as a P-type semiconductor and an N-type semiconductor so as to realize a photoelectric conversion function in which the PN junction 13 is irradiated with light and photoelectrons are excited to obtain a photoelectric current.

Here, the N-type oxide layer 11 is formed of an oxide having a perovskite structure containing titanium and strontium and is configured such that a part of strontium is substituted with a +3 valence metal element or a part of titanium is substituted with a +5 valence metal element, and the amount of the metal element substituted in the N-type oxide layer 11 is 0.01 mass % to 0.75 mass %. Accordingly, it is possible to provide a semiconductor type photoelectric conversion element 10 capable of obtaining a large photoelectric current and having excellent simplicity and mass productivity. The amount of the metal element substituted in the N-type oxide layer 11 is preferably 0.05 mass % to 0.75 mass %. Accordingly, the photoelectric conversion element 10 is easily provided.

Specifically, the N-type oxide layer 11 can be formed using strontium titanate ($SrTiO_3$) having a perovskite structure doped with a metal element.

In the perovskite type structure, that is, an $ABO_3$ type structure, an A site is coordinated with 12 oxygen atoms and a B site is coordinated with 6 oxygen atoms so as to form an octahedron. Strontium (Sr) is positioned at the A site and titanium (Ti) is positioned at the B site. Those which are shifted from a composition in which a part of elements is deficient or excessive, or a part of the elements is substituted with another element are also included in the perovskite type structure. An inevitable shift of the compositions due to a lattice mismatch, oxygen deficiency, substitution of some elements or the like is permitted as far as a perovskite structure can be obtained. For example, when a stoichiometric composition ratio is 1, a composition in the range of 0.85 to 1.20 is permitted.

As the metal element to be doped, a lanthanide element is preferably doped and lanthanum (La) is particularly preferably doped to strontium (Sr). Accordingly, the photoelectric conversion element 10 capable of obtaining a large photoelectric current is easily provided so that a function as an N-type semiconductor can be suitably provided. However, the metal element to be doped is not limited to the examples as long as it is the range not departing from the scope of the invention and for example, niobium (Nb) is preferably doped to titanium (Ti).

The N-type oxide layer 11 of the embodiment is transparent and thus incident light can pass through the oxide layer to reach the PN junction 13. In this manner, when the N-type oxide layer 11 side is configured to function as a light receiving surface, the higher the translucency is, the more preferable it is. However, the oxide layer does not need to be completely transparent and may be substantially transparent to such a degree that the incident light passes through the N-type oxide layer 11 to reach the P-type oxide layer 12.

The thickness of the N-type oxide layer 11 is not limited and when the oxide layer is thick, the strength is improved or the carrier concentration is increased and thus the conductivity is improved. On the other hand, the transmission distance until the incident light reaches the P-type oxide layer 12 from the incident surface is increased and thus the transmittance is easily lowered. Therefore, the thickness of the N-type oxide layer 11 may be appropriately selected in consideration of the strength, conductivity, transmittance, and the like. The shape of the N-type oxide layer 11 may be, for example a layered shape or a thin film shape but is not limited to the above examples.

On the other hand, the P-type oxide layer 12 is formed of a material capable of forming the PN junction 13 between the above-described N-type oxide layer 11 and the P-type oxide layer. For example, the P-type oxide layer 12 is preferably formed of an oxide having a perovskite structure. Accordingly, a good PN junction 13 can be formed between the above-described N-type oxide layer 11 and the P-type oxide layer.

Specifically, examples of the material for the P-type oxide layer 12 include a perovskite material such as lead titanate ($PbTiO_3$), lead zirconate titanate ($Pb(Zr,Ti)O_3$), lithium niobate ($LiNbO_3$), lithium tantalite ($LiTaO_3$), sodium niobate ($NaNbO_3$), sodium tantalite ($NaTaO_3$), potassium niobate ($KNbO_3$), potassium tantalite ($KTaO_3$), bismuth sodium titanate (($Bi_{1/2}Na_{1/2}$)$TiO_3$), bismuth potassium titanate (($Bi_{1/2}K_{1/2}$)$TiO_3$), and bismuth ferrate ($BiFeO_3$), a material obtained by substituting a part of the A side or B side of the perovskite materials with another element, and a solid-solution having at least one of the above-described materials as a component.

The P-type oxide layer 12 can be typically formed by using a composite oxide having a bismuth ferrate ($BiFeO_3$)-based or lead zirconate titanate (PZT)-based perovskite structure. Accordingly, the good PN junction 13 can be more easily formed between the P-type oxide layer and the N-type oxide layer. However, the material is not limited to the examples as long as the material becomes a P-type oxide.

Examples of the element that substitutes a part of the A site include at least one element selected from lead (Pb), calcium (Ca), strontium (Sr), barium (Ba), lithium (Li), sodium (Na), and potassium (K). Accordingly, a function as a P-type semiconductor is easily provided.

Examples of the element that substitutes a part of the B site further include at least one element selected from aluminum (Al), chromium (Cr), iron (Fe), cobalt (Co), nickel (Ni), copper (Cu), and zinc (Zn). Accordingly, a function as a P-type semiconductor is easily provided.

In the embodiment, since the N-type oxide layer 11 side is configured to function as a light receiving surface, the P-type oxide layer 12 positioned on the opposite side thereof is not necessarily transparent but may be formed of a transparent material.

The thickness of the P-type oxide layer 12 is not limited as long as the scope of the invention is not changed. The thickness of the P-type oxide layer is determined within the range capable of obtaining a function as a P-type semiconductor. However, from the viewpoint of holding the mechanical strength, the P-type oxide layer may be of a certain degree of thickness. For example, the shape of the P-type oxide layer 12 can be a layered shape or a thin film shape but is not limited to the above-described examples.

Such a P-type oxide layer 12 can be formed on, for example, the N-type oxide layer 11 by a film forming process. With regard to an oxide film having a perovskite structure, film formation is relatively easy, and the thus-configured photoelectric conversion element 10 has excellent simplicity and mass productivity and good reproducibility.

The material for the counter electrode 14 is not limited as long as the electrode has conductivity. Examples thereof include metal materials such as platinum (Pt), iridium (Ir), gold (Au), aluminum (Al), copper (Cu), titanium (Ti), and stainless steel, tin oxide-based conductive materials such as indium tin oxide (ITO) and fluorine-doped tin oxide (FTO), zinc oxide based conductive materials, oxide conductive materials such as strontium ruthenate ($SrRuO_3$), lanthanum nickelate ($LaNiO_3$), and element-doped strontium titanate, and a conductive polymer. However, the material is not limited to the above-described examples.

In the embodiment, since the N-type oxide layer 11 is configured to function as a light receiving surface, the counter electrode 14 is not necessarily transparent but may be formed of a transparent material. The counter electrode 14 is formed of a metal material so as to reflect the light incident on the N-type oxide layer 11 and passing through the P-type oxide layer 12.

The thickness and the shape of the counter electrode 14 are not limited and can be appropriately selected as long as the conductivity, the mechanical strength, and the like can be secured. When the counter electrode 14 side functions as a light receiving surface, the thickness and the shape of the counter electrode, and further, the surface roughness of the P-type oxide layer 12 with respect to the counter electrode 14 can be selected in consideration of the translucency.

According to such an embodiment, it is possible to provide the photoelectric conversion element 10 capable of obtaining a large photoelectric current and having excellent simplicity and mass productivity.

FIG. 1B is a view showing the schematic configuration of an optical sensor 20 including the photoelectric conversion element 10 according to the embodiment. The optical sensor 20 can be manufactured by, for example, connecting a known current detecting apparatus 21 to the N-type oxide layer 11 and the P-type oxide layer 12 with a wiring 22.

In the optical sensor 20, the light hv emitted from the N-type oxide layer 11 side passes through the N-type oxide layer 11 to reach the P-type oxide layer 12 and is absorbed by the N-type oxide layer 11 and the P-type oxide layer 12 to generate a carrier.

In the generated carrier, electrons move to the N-type oxide layer 11 side and positive holes move to the P-type oxide layer 12 side by an internal electric field formed by the N-type oxide layer 11 and the P-type oxide layer 12 and thus a photoelectric current $I_{hv}$ is generated. The photoelectric current $I_{hv}$ is measured by, for example, the current detecting apparatus 21.

Since the optical sensor 20 of the embodiment includes the photoelectric conversion element 10, a large photoelectric current can be obtained and excellent simplicity and mass productivity can be achieved.

Next, a method for manufacturing the photoelectric conversion element 10 will be described.

The photoelectric conversion element 10 can be obtained by, for example, sequentially forming the P-type oxide layer 12 and the counter electrode 14 on the N-type oxide layer 11 by a film forming process. In the embodiment, the N-type oxide layer 11 and, in some cases, the P-type oxide layer 12 are formed of an oxide having a perovskite structure. Such an oxide having a perovskite structure can be relatively easily formed and an element with good reproducibility can be manufactured without strictly limiting the manufacturing conditions. Therefore, the element is simply manufactured and the reproducibility is good compared to processes in the related art, for example, a process of forming P-type and N-type regions by doping silicon to an element.

Examples of the film forming process include a vapor phase method such as a CVD method, a liquid phase method such as an application method, a solid phase method such as a sputtering method, and a printing method. However, there is no limitation thereto. In the case of using an oxide having a perovskite structure in the P-type oxide layer 12, as long as the P-type oxide layer 12 is formed on the N-type oxide layer 11 by a solution application method, the photoelectric conversion element 10 can be manufactured by a simple process and is advantageous in mass productivity.

In addition to the method for preparing a film structure, the N-type oxide layer 11 and the P-type oxide layer 12 can be manufactured by a method for preparing a lumpy structure, such as a method of using a raw material powder to form a desired shape or applying a raw material powder to a desired pattern, and then firing the raw material powder, or a method of forming a single crystalline or polycrystalline substrate by vapor phase growing and cutting the substrate.

In this manner, according to the embodiment, it is possible to provide the method for manufacturing the photoelectric conversion element 10 capable of obtaining a large photoelectric current and having excellent simplicity and mass productivity.

Figure 2A:
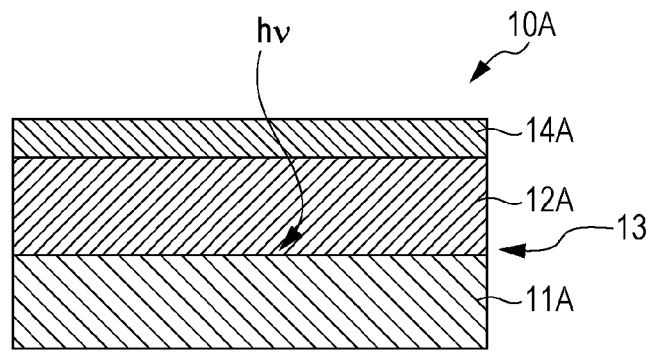
FIGS. 2A to 2C are views showing configuration examples of a photoelectric conversion element according to an embodiment of the invention.
Figure 2B:
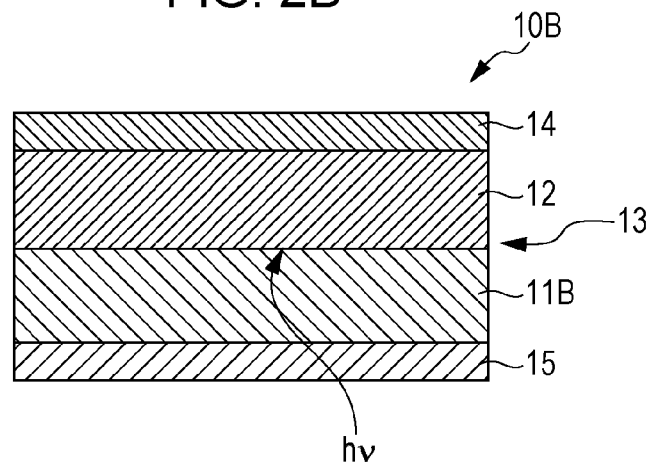
Figure 2C:
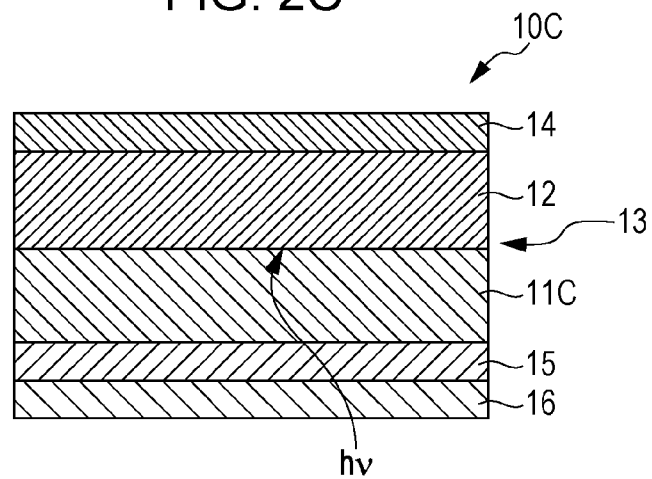

FIGS. 2A to 2C are views showing configuration examples of a photoelectric conversion element according to another embodiment.

A photoelectric conversion element 10A shown in FIG. 2A is configured such that a P-type oxide layer 12A and a counter electrode 14A are transparent and the counter electrode 14A side functions as a light receiving surface.

Even in such a photoelectric conversion element 10A, as described above, the amount of a metal element that substitutes strontium and titanium in the N-type oxide layer 11 is 0.01 mass % to 0.75 mass %, and preferably 0.05 mass % to 0.75 mass %. According to the embodiment, it is possible to provide the photoelectric conversion element 10A capable of obtaining a large photoelectric current and having excellent simplicity and mass productivity.

In the photoelectric conversion element 10A, since the counter electrode 14A functions as a light receiving surface, an N-type oxide layer 11A is not necessarily transparent. That is, in the photoelectric conversion element 10A, a degree of freedom on material selection for the N-type oxide layer 11A is excellent.

In addition, in a photoelectric conversion element 10B shown in FIG. 2B, an N-type oxide layer 11B is formed of a transparent material but does not function as a substrate, and thus, a transparent substrate 15 is separately provided on the opposite side of the P-type oxide layer 12. That is, in the photoelectric conversion element 10B, the transparent substrate 15 side functions as a light receiving surface.

In the embodiment shown in FIG. 2B, as described above, the amount of a metal element that substitutes strontium and titanium in the N-type oxide layer 11 is 0.01 mass % to 0.75 mass %, and preferably 0.05 mass % to 0.75 mass %. According to the embodiment, it is possible to provide the photoelectric conversion element 10B capable of obtaining a large photoelectric current and having excellent simplicity and mass productivity.

Further, in a photoelectric conversion element 10C shown in FIG. 2C, an N-type oxide layer 11C is formed of a transparent material but does not function as a substrate and an electrode, and thus, the transparent substrate 15 and a transparent electrode 16 are separately provided on the opposite side of the P-type oxide layer 12. That is, in the photoelectric conversion element 10C, the transparent substrate 15 side functions as a light receiving surface.

Even In the embodiment shown in FIG. 2C, as described above, the amount of a metal element that substitutes strontium and titanium in the N-type oxide layer 11 is 0.01 mass % to 0.75 mass %, and preferably 0.05 mass % to 0.75 mass %. According to the embodiment, it is possible to provide the photoelectric conversion element 10C capable of obtaining a large photoelectric current and having excellent simplicity and mass productivity.

Further, the substitution amount in the embodiment refers to a ratio in the total N-type oxide. In addition, the substitution amount from the formed oxide layer can be measured by carrying out, for example, glow discharge light emission analysis and SIMS analysis.

EXAMPLES

Example 1

A thin film of a $BiFeO_3$-based P-type oxide material was formed on a $SrTiO_3$ (100) substrate (N-type oxide layer 11) doped with 0.75 mass % of lanthanum (La) and an ITO electrode was formed on the thin film to prepare a photoelectric conversion element (refer to the configuration shown in FIG. 1A).

The thin film of a $BiFeO_3$-based P-type oxide material was formed according to a spin coating method. Various solutions of Bi, Fe, Mn, Ba, and Ti, in which 2-ethylhexanoate was used as a ligand, and n-octane was used as a solvent, were mixed in a substance amount ratio of Bi:Fe:Mn:Ba:Ti=75:71.25:3.75:25:25 to prepare a solution. Next, the prepared solution was applied onto the $SrTiO_3$ (100) substrate doped with 0.75 mass % of La at 1,500 rpm according to the spin coating method, heating was carried out for two minutes at 180° C., and then heating was carried out for two minutes at 350° C. The processes were repeated three times, and then heating was carried out for five minutes at 650° C. in a nitrogen atmosphere by using a rapid thermal annealing apparatus (RTA). The above-described processes were repeated three times to prepare a $BiFeO_3$-based thin film (P-type oxide layer 12) which was constituted by a total of 9 layers and which had a film thickness of 0.6 μm.

Next, an ITO electrode was formed according to a spin coating method. A commercially available ITO thin film coating agent (ITO-05C, manufactured by High Purity Chemical Co.) was applied to the $BiFeO_3$-based thin film at 1,500 rpm according to the spin coating method, heating was carried out for two minutes at 180° C., and then heating was carried out for two minutes at 350° C. The processes were repeated two times, and then heating was carried out for ten minutes at 650° C. in a nitrogen atmosphere by using a kiln (at a temperature rising rate of 400° C./hour). By the above-described processes, a thin film ITO electrode (counter electrode 14) having a thickness of 0.1 μm was prepared.

By the above-described process, a photoelectric conversion element according to Example 1 was prepared.

Comparative Example 1

A $BiFeO_3$-based thin film and an ITO electrode obtained by the same process as in Example 1 were formed on a $SrTiO_3$ (100) substrate doped with 3.73 mass % of La to prepare a photoelectric conversion element according to Comparative Example 1.

Example 2

A photoelectric conversion element according to Example 2 was prepared by the same process as in Example 1 except that a change was made such that as the raw material for the $BiFeO_3$-based thin film, various solutions of Bi, La, Fe, Mn, and Ti, in which 2-ethylhexanoate was used as a ligand, and n-octane was used as a solvent, were mixed in a substance amount ratio of Bi:La:Fe:Mn:Ti=85:15:94:1:5.

Comparative Example 2

A $BiFeO_3$-based thin film and an ITO electrode obtained by the same process as in Example 2 were formed on a $SrTiO_3$ (100) substrate doped with 3.73 mass % of La to prepare a photoelectric conversion element according to Comparative Example 2.

Example 3

A photoelectric conversion element according to Example 3 was prepared by the same process as in Example 2 except that the number of repeated processes from spin coating of a BiFeO$_3$-based thin film to a heating process at 350° C. was set to three times and the number of repeated processes from spin coating to RTA firing was set to two times, and the number of layers in the BiFeO$_3$-based thin film was changed to 6 and thickness was changed to 0.4 μm.

Comparative Example 3

A BiFeO$_3$-based thin film and an ITO electrode obtained by the same process as in Example 3 were formed on a SrTiO$_3$ (100) substrate doped with 3.73 mass % of La to prepare a photoelectric conversion element according to Comparative Example 3.

Example 4

A Pb(Zr$_{0.3}$Ti$_{0.7}$)O$_3$ thin film (PZT thin film) was prepared according to a spin coating method instead of a BiFeO$_3$-based thin film. As a raw material solution, lead acetate, a butanol solution of Zr and Ti alkoxides, and an n-octane solution of Al 2-ethylhexanoate were mixed in a substance amount ratio of Pb:Zr:Ti:Al=110:30:70:5 to prepare a solution. Next, the prepared solution was applied to a SrTiO$_3$ (100) substrate doped with 0.75 mass % of La at 2,500 rpm according to the spin coating method, heating was carried out for two minutes at 180° C., and then heating was carried out for two minutes at 350° C. The processes were repeated two times, and then heating was carried out for five minutes at 650° C. in a nitrogen atmosphere by using RTA. The above-described processes repeated two times to prepare an Al added PZT thin film (P-type oxide layer 12) which was constituted by a total of 4 layers and which had a film thickness of 0.4 p.m.

Thereafter, an ITO electrode was prepared by the same process as in Example 1 to 3 to prepare a photoelectric conversion element according to Example 4.

Comparative Example 4

An Al added PZT thin film and an ITO electrode obtained by the same process as in Example 4 were formed on a SrTiO$_3$ (100) substrate doped with 3.73 mass % of La to prepare a photoelectric conversion element according to Comparative Example 4.

Example 5

A photoelectric conversion element according to Example 5 was prepared by the same process as in Example 4 except that the number of repeated processes from spin coating of an Al added PZT thin film to a heating process at 350° C. was set to one time and the number of repeated processes from spin coating to RTA firing was set to two times, and the number of layers in the Al added PZT thin film was changed to 2 and the thickness was changed to 0.2 μm.

Comparative Example 5

An Al added PZT thin film and an ITO electrode obtained by the same process as in Example 5 were formed on a SrTiO$_3$ (100) substrate doped with 3.73 mass % of La to prepare a photoelectric conversion element according to Comparative Example 5.

Example 6

An Al added PZT thin film and an ITO electrode obtained by the same process as in Example 5 were formed on a SrTiO$_3$ (100) substrate doped with 0.38 mass % of La to prepare a photoelectric conversion element according to Example 6.

Example 7

An Al added PZT thin film and an ITO electrode obtained by the same process as in Example 5 were formed on a SrTiO$_3$ (100) substrate doped with 0.05 mass % of Nb to prepare a photoelectric conversion element according to Example 7.

Example 8

An Al added PZT thin film and an ITO electrode obtained by the same process as in Example 5 were formed on a SrTiO$_3$ (100) substrate doped with 0.01 mass % of Nb to prepare a photoelectric conversion element according to Example 8.

Example 9

An Al added PZT thin film and an ITO electrode were formed on a SrTiO$_3$ (100) substrate doped with 0.05 mass % of Nb to prepare a photoelectric conversion element according to Example 9 by the same process as in Examples 4 to 8 except that the number of repeated processes from spin coating of the Al added PZT thin film to a heating process at 350° C. was set to one time and the number of repeated processes from spin coating to RTA firing was set to one time, and the number of layers in the Al added PZT thin film was changed to 1 and the thickness was changed to 0.1 p.m.

Example 10

An Al added PZT thin film and an ITO electrode were formed on a SrTiO$_3$ (100) substrate doped with 0.01 mass % of Nb to prepare a photoelectric conversion element according to Example 10 by the same process as in Example 9.

Test Example

The photoelectric conversion elements according to Examples 1 to 7 and Comparative Examples 1 to 5 were irradiated with black light having an intensity of 1.4 mW/cm$^2$ (a wavelength of 365 nm) from the ITO electrode side to measure an open circuit voltage Voc and a short circuit current Isc. The results are shown in Table 1.

Figure 3:
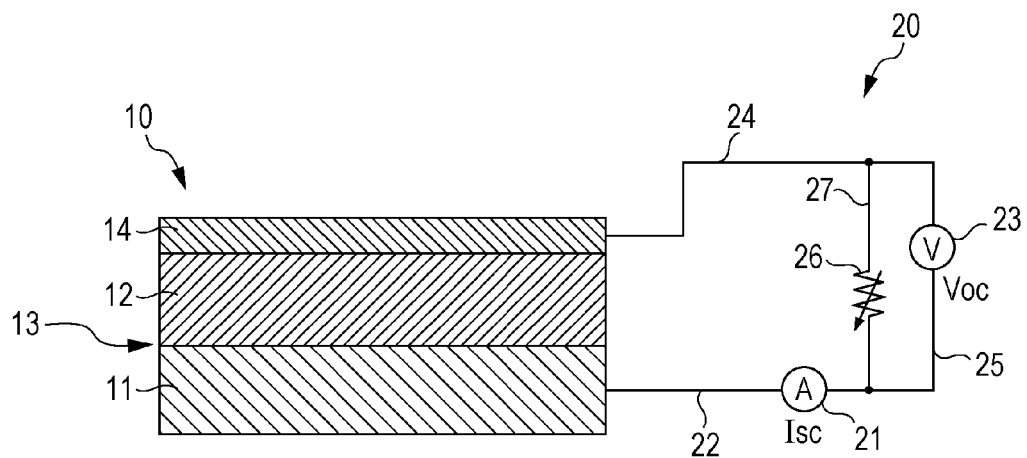
FIG. 3 is a view showing a configuration example of a photoelectric conversion element according to an embodiment of the invention.

Further, the open circuit voltage Voc and the short circuit current Isc were measured as follows. That is, as shown in FIG. 3, for example, in the photoelectric conversion element 10 according to Example 1, the N-type oxide layer 11, the current detecting apparatus 21 were connected through the wiring 22 and the counter electrode 14 and a current detecting apparatus 23 were connected through a wiring 24, and the current detecting apparatus 21 and the current detecting apparatus 23 were connected through a wiring 25. Then, the wiring 24 and the wiring 25 were connected by a wiring 27 through a variable resistor 26.

Here, the resistance of the variable resistor 26 was adjusted such that a current flowing in an external circuit was 0 A. At this time, the voltage was measured and the value was set to the open circuit voltage Voc (mV). In addition, the resistance of the variable resistor 26 was adjusted to 0Ω such that the voltage applied to the outside was 0 V. At this time, the voltage was measured and the value was set to the short circuit current Isc (μm).

Generally, the open circuit voltage Voc is the maximum voltage that can be generated by the photoelectric conversion element and the short circuit current Isc is the maximum current that can be generated by a photoelectric conversion apparatus. Accordingly, the larger the product of the open circuit voltage Voc and the short circuit current Isc is, the larger the theoretical amount of power generated by the photoelectric conversion element is, and a large photoelectric current is obtained.

TABLE 1

| | Example | | Comparative Example | |
|---|---|---|---|---|
| | Open circuit voltage [mv] | Short circuit current [μa/cm$^2$] | Open circuit voltage [mv] | Short circuit current [μa/cm$^2$] |
| 1 | 3.9 | 0.1 | 0.7 | <0.1 |
| 2 | 0.9 | 0.1 | 0.3 | 0.1 |
| 3 | 177.2 | 0.1 | 16.7 | 0.1 |
| 4 | 69.4 | 0.1 | 34.9 | 0.1 |
| 5 | 991.8 | 13.5 | 400.3 | 3.5 |
| 6 | 577.2 | 15.6 | | |
| 7 | 619.4 | 20.1 | | |
| 8 | 840.4 | 14.3 | | |
| 9 | 859.2 | 25.3 | | |
| 10 | 813.0 | 59.7 | | |

As shown in Table 1, it was found that the product of the open circuit voltage and the short circuit current was larger and a larger photoelectric current was able to be obtained in the photoelectric conversion elements according to all Examples 1 to 5 compared to the photoelectric conversion elements according to the corresponding Comparative Examples 1 to 5. In addition, it was found that the product of the open circuit voltage and the short circuit current was also larger and a larger photoelectric current was able to be obtained in the photoelectric conversion elements according to Examples 6 and 7 compared to the photoelectric conversion element according to the corresponding Comparative Example 5 from the viewpoint of including the same process as in Example 5. Particularly, it was confirmed that an open circuit voltage larger by one digit was obtained in the photoelectric conversion element according to Example 3 compared to the photoelectric conversion element according to the corresponding Comparative Example 3, a short circuit current larger by one digit was obtained in the photoelectric conversion elements according to Examples 5 to 8 compared to the photoelectric conversion element according to the corresponding Comparative Example 5, and a much larger short circuit current was obtained in Examples 9 and 10 in which the thickness of the Al added PZT thin film was reduced compared to Examples 7 and 8. The photoelectric conversion elements according to Examples 1 to 10 had excellent simplicity and mass productivity.

OTHER EMBODIMENTS

The embodiment of the invention has been described above. The photoelectric conversion element according to the embodiment can be widely used in, for example, optical power generation including solar power generation and an optical sensing system using a photodetector but the basic structure thereof is not limited to the above-described structure.

Figure 4:
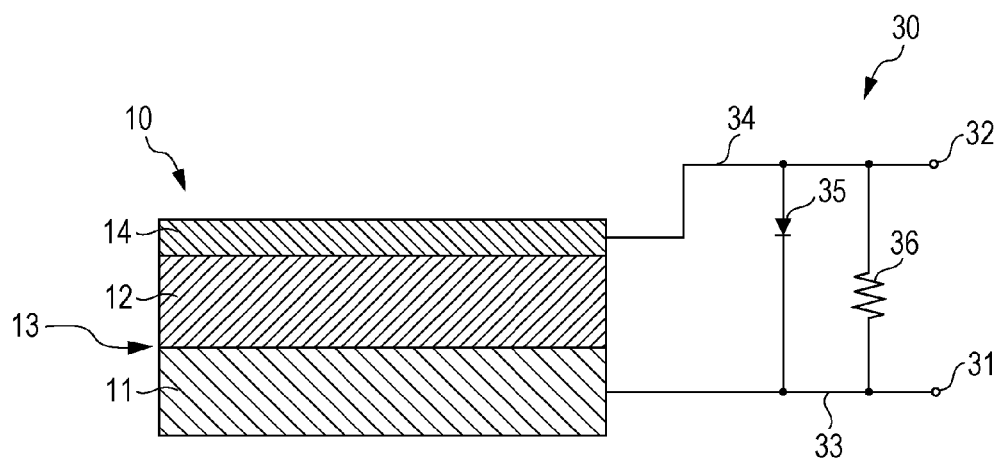
FIG. 4 is a view showing a configuration example of a solar cell according to an embodiment of the invention.

For example, as shown in FIG. 4, the photoelectric conversion element 10 can be provided to configure a solar cell 30. For example, the solar cell 30 can be prepared by connecting the N-type oxide layer 11 and the counter electrode 14 of the photoelectric conversion element 10 receptively to wirings 33 and 34 for connection to terminals 31 and 32, and arranging a diode 35 and a resistance 36 between the wirings 33 and 34 as required.

According to the solar cell 30, since the photoelectric conversion element 10 is provided therein, a large photoelectric current can be obtained and excellent simplicity and mass productivity are obtained.

The entire disclosure of Japanese Patent Application Nos: 2013-250574, filed Dec. 3, 2013 and 2014-43283, filed Mar. 5, 2014 are expressly incorporated by reference herein.

What is claimed is:

1. A photoelectric conversion element comprising:
   a PN junction formed between an N-type oxide layer and a P-type oxide layer,
   wherein the N-type oxide layer is formed of an oxide having a perovskite structure containing titanium and strontium,
   a part of strontium is substituted with a +3 valence metal element or a part of titanium is substituted with a +5 valence metal element, and
   the amount of the metal element substituted in the N-type oxide layer is 0.01 mass % to 0.75 mass %.

2. The photoelectric conversion element according to claim 1,
   wherein the amount of the metal element substituted in the N-type oxide layer is 0.05 mass % to 0.75 mass %.

3. The photoelectric conversion element according to claim 1,
   wherein the metal element is a lanthanoid element or a niobium element.

4. The photoelectric conversion element according to claim 1,
   wherein the P-type oxide layer is formed of an oxide having a perovskite structure.

5. The photoelectric conversion element according to claim 1,
   wherein the P-type oxide layer is formed of bismuth ferrate or lead zirconate titanate.

6. The photoelectric conversion element according to claim 1,
   wherein the P-type oxide layer further contains at least one element selected from lead, calcium, strontium, barium, lithium, sodium, and potassium at an A site.

7. The photoelectric conversion element according to claim 3,
   wherein the P-type oxide layer further contains at least one element selected from aluminum, chrome, iron, cobalt, nickel, copper, and zinc at a B side.

8. The photoelectric conversion element according to claim 1,
   wherein the P-type oxide layer is formed on a substrate formed of an N-type oxide by a film forming process to form the PN junction.

9. An optical sensor comprising the photoelectric conversion element according claim 1.

10. A solar cell comprising the photoelectric conversion element according claim 1.

* * * * *